United States Patent
Hanada et al.

(10) Patent No.: US 9,530,586 B2
(45) Date of Patent: Dec. 27, 2016

(54) TOUCH SWITCH DEVICE WITH ILLUMINATOR

(71) Applicant: TOYOTA BOSHOKU KABUSHIKI KAISHA, Aichen-ken (JP)

(72) Inventors: Naoya Hanada, Aichi-ken (JP); Nobuki Hayashi, Aichi-ken (JP)

(73) Assignee: TOYOTA BOSHOKU KABUSHIKI KAISHA, Aichi-Ken (JP)

( * ) Notice: Subject to any disclaimer, the term of this patent is extended or adjusted under 35 U.S.C. 154(b) by 57 days.

(21) Appl. No.: 14/302,930

(22) Filed: Jun. 12, 2014

(65) Prior Publication Data
US 2014/0374232 A1    Dec. 25, 2014

(30) Foreign Application Priority Data

Jun. 21, 2013    (JP) .................................. 2013-130823

(51) Int. Cl.
*H01H 9/16*    (2006.01)
*H03K 17/96*    (2006.01)

(52) U.S. Cl.
CPC ............ *H01H 9/161* (2013.01); *H03K 17/962* (2013.01); *H01H 2219/062* (2013.01); *H01H 2239/006* (2013.01); *H01H 2239/074* (2013.01); *H03K 2017/9606* (2013.01); *H03K 2217/960795* (2013.01)

(58) Field of Classification Search
CPC ................................. H01H 9/16; H03K 17/96
USPC ................................................ 200/5 A, 600
See application file for complete search history.

(56) References Cited

U.S. PATENT DOCUMENTS

2007/0210163 A1    9/2007    Han
2009/0107829 A1*   4/2009    Heimann ............. H03K 17/962
                                                    200/600

(Continued)

FOREIGN PATENT DOCUMENTS

EP    2405457    *  1/2012    .......... H01H 13/705
JP    2002-40423      2/2002

(Continued)

OTHER PUBLICATIONS

Official Action, along with English-language translation thereof, for JP Appl. No. 2013-130823 dated Sep. 20, 2016.

*Primary Examiner* — Edwin A. Leon
*Assistant Examiner* — Iman Malakooti
(74) *Attorney, Agent, or Firm* — Greenblum & Bernstein, P.L.C.

(57) ABSTRACT

A touch switch device with an illuminator for detecting a close approach or contact of a human body to an operation surface includes: a wiring board having a light-emitting device and a detection electrode on a one surface side; a light guide plate located on the one surface side of the wiring board to emit light from the light-emitting device to the outside from the operation surface opposite the wiring board; and a detector connected with the detection electrode to detect change in electrostatic capacity to be generated at the detection electrode when a human body closely approaches or contacts the operation surface to produce a detection signal corresponding to the detected condition. An operation part is displayable on a surface of the light guide plate to serve as the operation surface, and the operation part is positioned corresponding to a position of the detection electrode.

8 Claims, 3 Drawing Sheets

(56) References Cited

U.S. PATENT DOCUMENTS

2013/0062180 A1* 3/2013 Uenomachi ............ G06F 3/042
                                                      200/600
2013/0088175 A1   4/2013 Nishikawa et al.
2013/0313099 A1   11/2013 Komaki et al.

FOREIGN PATENT DOCUMENTS

| JP | 2006-321336 | * | 11/2006 | ............ B60R 16/02 |
| JP | 2007-234584 |   | 9/2007  |                         |
| JP | 2008-10286  |   | 1/2008  |                         |
| JP | 2010-120487 | * | 6/2010  | ............ B60R 16/02 |
| JP | 3172080     |   | 12/2011 |                         |

* cited by examiner

TOUCH SWITCH DEVICE WITH ILLUMINATOR

CROSS-REFERENCE TO RELATED APPLICATIONS

The present application claims priority under 35 U.S.C. §119 of Japanese Application No. 2013-130823 filed on Jun. 21, 2013, the disclosure of which is expressly incorporated by reference herein in its entirety.

BACKGROUND

Technical Field

The present disclosure relates to a touch switch device with an illuminator. More specifically, the present disclosure relates to a touch switch device with an illuminator that has a reduced width with a smaller number of components and has higher visibility and operability as well as a better design.

Background Art

In various types of apparatuses and equipment that can be installed indoors and outdoors, there have been widely used touch sensors (touch switches) having one or more switch parts, e.g., operation parts and detection electrodes, at an operating portion to be closely approached or contacted by a human finger or the like. In such a touch sensor, the close approach or contact of a human body to the detection electrode is detected by measuring change in stray capacitance generated at the detection electrode or in electrostatic capacitance that is generated between the detection electrode and the earth.

Switches with an illuminator having an illuminable operation part are used in vehicles also, in order to facilitate, even in dark places, the operation of various types of devices and instruments that are equipped in cabins, such as lamps, air conditioners, and audio/video devices. For example, as a switch device that collectively performs various operations of in-vehicle instruments, an in-cabin switch device combining an operation plate with a touch sensor is under consideration (see JP-A-2010-120487). The in-cabin switch device described in JP-A-2010-120487 includes, for example, a decorative panel, a mask, an electrode substrate with a sensor electrode, a holder, and a control board. Patterns indicating touch positions and the names of functions are arranged on the mask, so as to be illuminated by an LED on the control board.

Patent Document 1: JP-A-2010-120487

However, the touch switch device with an illuminator as disclosed in Patent Document 1 includes a large number of components, e.g., an electrode substrate besides the control board, and the assembly is complicated. Further, reduction in width of the switch device is hard to achieve as mounting space is secured at the back of the operation surface. Moreover, because of the longer distance from the control circuit on the control board to the sensor electrode, the switch device is susceptible to external noise.

SUMMARY

Embodiments of the present invention are made in view of the foregoing circumstances and provide a touch switch device with an illuminator that has a reduced width with a fewer number of components and has higher visibility and operability as well as a better design.

One aspect of the present embodiments provides a touch switch device with an illuminator for detecting a close approach or contact of a human body to an operation surface, includes: a planar wiring board having a light-emitting device and a detection electrode provided on a one surface side; a light guide plate located on the one surface side of the wiring board, the light guide plate being configured to emit light to be introduced from the light-emitting device to outside from the operation surface that is opposite the wiring board; and a detector connected with the detection electrode, the detector being configured to perform detection of a change in electrostatic capacitance to be generated at the detection electrode when a human body closely approaches or contacts the operation surface, to produce a detection signal corresponding to a condition of the detection, wherein an operation part is displayable on a surface of the light guide plate to serve as the operation surface, and the operation part is positioned corresponding to a position of the detection electrode.

In a further aspect, the operation part is displayable by way of a transmission pattern for transmitting light from the light guide plate to the outside, and the operation surface of the light guide plate excluding the transmission pattern is light-shielded.

In a further aspect, the light guide plate includes: a planar light guide plate main body disposed to cover at least the detection electrode portion; and an extended portion extending from the light guide plate main body to the side of the wiring board, the extended, portion being configured to guide light to be discharged from the light-emitting device to the light guide plate main body.

In a further aspect, the operation part is displayable by way of a transmission pattern for transmitting light from the light guide plate to the outside, the operation surface of the light guide plate excluding the transmission pattern is light-shielded, and the light guide plate includes: a planar light guide plate main body disposed to cover at least the detection electrode portion; and an extended portion extending from the light guide plate main body to the side of the wiring board, the extended portion being configured to guide light to be discharged from the light-emitting device to the light guide plate main body.

In a further aspect, a plurality of the operation parts is arranged on one light guide plate and a plurality of the detection electrodes is arranged on one wiring board, corresponding to positions of the operation parts.

In a further aspect, the detector is configured to control illumination of the light-emitting device according to the condition of the detection.

In a further aspect, the light guide plate includes a locking pawl extending to the side of the wiring board, and the light guide plate and the wiring board are integrally engaged with each other by the locking pawl.

A touch switch device with an illuminator according to the present embodiments for detecting a close approach or contact of a human body to an operation surface includes: a planar wiring board having a light-emitting device and a detection electrode provided on a one surface side; a light guide plate located on the one surface side of the wiring board, the light guide plate being configured to emit light to be introduced from the light-emitting device to outside from the operation surface that is opposite the wiring board; and a detector connected with the detection electrode, the detector being configured to perform detection of a change in electrostatic capacitance to be generated at the detection electrode when a human body closely approaches or contacts the operation surface, to produce a detection signal corresponding to a condition of the detection. Thus, visibility is enhanced by guiding the light that is introduced from the light-emitting device into the light guide plate to emit the light from the operation surface. Further, an operation part is displayable on a surface of the light guide plate to serve as the operation surface, and the operation part is positioned corresponding to a position of the detection electrode. Thus, the detection electrode may be disposed immediately below the operation part, thus enhancing operability. The operation part may be displayed in a readily perceivable manner by using, for example, any figures and/or characters on the operation surface. Moreover, the structure may be configured with one light guide plate and one wiring board, thus providing for an readily constructible, thinner touch switch device with an illuminator having an extremely smaller number of components and a simpler structure.

In a case where the operation part is displayable by way of a transmission pattern for transmitting light from the light guide plate to the outside and the operation surface of the light guide plate excluding the transmission pattern is light-shielded, an operation surface with a better design is provided. Since a light-shielding layer may be formed by, for example, printing or coating on a surface (the operation surface) of the light guide plate, a separate component for configuring the operation surface and the operation part is dispensed with.

In a case where the light guide plate includes: a planar light guide plate main body disposed to cover at least the detection electrode portion; and an extended portion extending from the light guide plate main body to the side of the wiring board, the extended portion being configured to guide light to be discharged from the light-emitting device to the light guide plate main body, the light from the light-emitting device is led into the light guide plate and is guided to the operation surface without using a separate component.

In a case where a plurality of the operation parts is arranged on one light guide plate described above and a plurality of the detection electrodes is arranged on one wiring board, corresponding to positions of the operation parts, the touch switch device with the illuminator that allows for a plurality of operations is structured integrally.

In a case where the detector is configured to control illumination of the light-emitting device according to the condition of the detection, the light-emitting device may be controlled according to whether or not a human body is closely approaching or contacting the operation surface to change, for example, the on/off state of the illumination, the intensity of the illumination, and/or the color of the illumination. This allows for clearer indication of the operation part and informing of the operation state to the operator.

In a case where the light guide plate includes a locking pawl extending to the side of the wiring board and the light guide plate and the wiring board are integrally engaged with each other by the locking pawl, assembly of the touch switch device with the illuminator is remarkably facilitated.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

EMBODIMENTS

Embodiments of the present invention are described in detail below with reference to the drawings.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Figure 1:
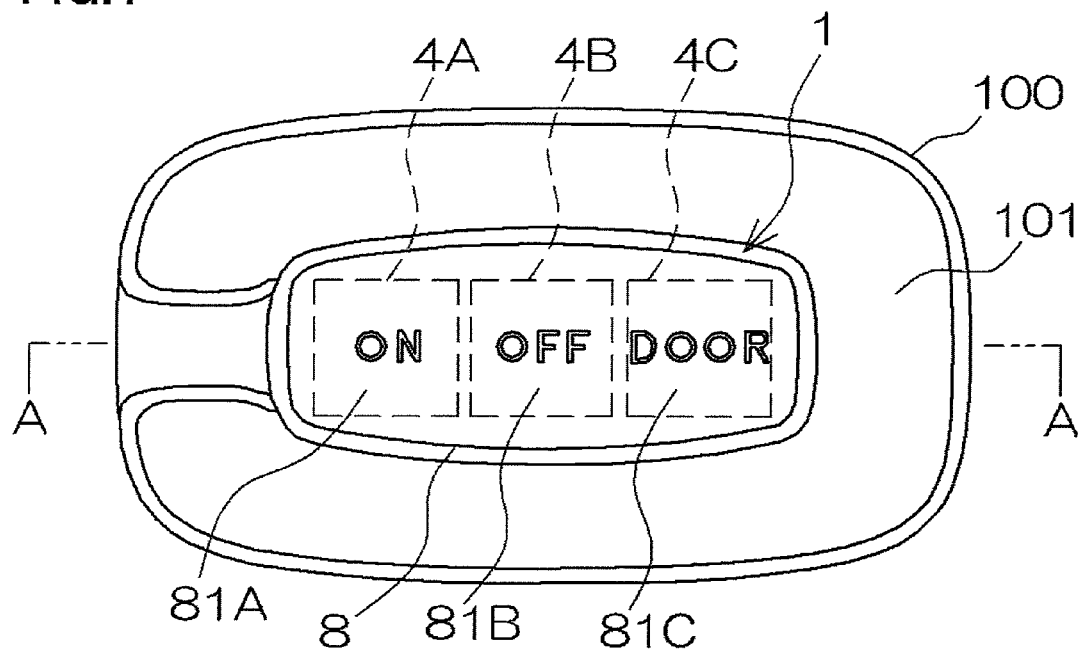
FIG. 1 is an explanatory plan view of an in-cabin lamp switch using a touch switch device with an illuminator.

FIG. 1 is a plan view of an in-cabin lamp switch (100) applied with a touch switch device (1) with an illuminator according to an embodiment as viewed from an operation surface side. The in-cabin lamp switch 100 exemplified herein is provided on the ceiling of a cabin, includes a light source, and is configured to illuminate the inside of the cabin with the light of the light source through an outer lens 101. One touch switch device 1 with an illuminator is positioned at a central portion as a switch for the light source. In this embodiment, three switch parts, i.e., operation parts 81, are arranged in line on a surface, i.e., an operation surface 8, of the human-operable touch switch device 1 with the illuminator, with the respective indications of "ON," "OFF," and "DOOR."

Figure 2:
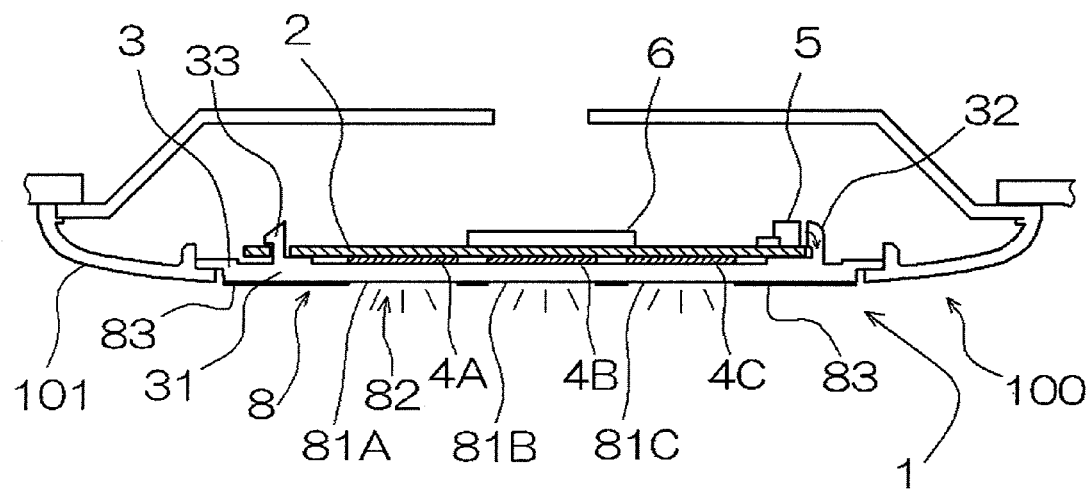
FIG. 2 is an explanatory cross-sectional view of the in-cabin lamp switch using the touch switch device with the illuminator.

FIG. 2 depicts a cross section taken along line A-A in FIG. 1 of the in-cabin lamp switch 100. In FIG. 2, the operation surface 8 comes below. The touch switch device 1 with the illuminator includes a planar wiring board 2, a light guide plate 3, and a detector 6 that is not depicted in FIGS. 1 and 2, and is configured to detect a close approach or contact of a human body such as a finger tip to the operation surface 8. The operation surface 8 of the touch switch device 1 with the illuminator is positioned on a surface of the light guide plate 3 on the side which a human body 9 closely approaches or contacts. The operation parts 81 refer to portions on the operation surface 8 which are operated by an operator to enable the touch switch device 1 with the illuminator to detect a close approach or contact of a human body. There is no particular limitation in terms of, for example, the number, position, shape, and size of the operation part 81 to be provided in one touch switch device 1 with an illuminator.

It is intended that the "close approach" of a human body to the operation part denotes a mode in which a palm or finger of a hand is brought close to a surface of the operation part, and that the "contact" denotes a mode in which a human body contacts the surface of the operation part. The close approach or contact with respect to the operation part is hereinafter referred to as a "touch."

The surface on which the light guide plate 3 is exposed as the operation surface 8 allows for any forms of display using characters and figures so as to instruct the operator which operation part 81 to touch. For example, the operation parts 81 may perform display through a transmission pattern that is configured to let light transmit therethrough from inside the light guide plate 3 to the outside. The operation parts 81 may be structured such that the operation surface excluding the transmission pattern of the light guide plate 3 is shielded by a light shield.

The transmission pattern and the light shield may be formed by any method, and may be formed by, for example, performing printing or coating on the surface of the light guide plate 3 to serve as the operation surface 8. Alternatively, a light-shielding film provided with the transmission pattern may be pasted on the surface of the light guide plate 3. The light shield formed by, for example, printing, coating, or the use of a light-shielding film may entirely prevent light from being emitted from inside the light guide plate 3 to the outside, or may slightly give off light.

Figure 5:
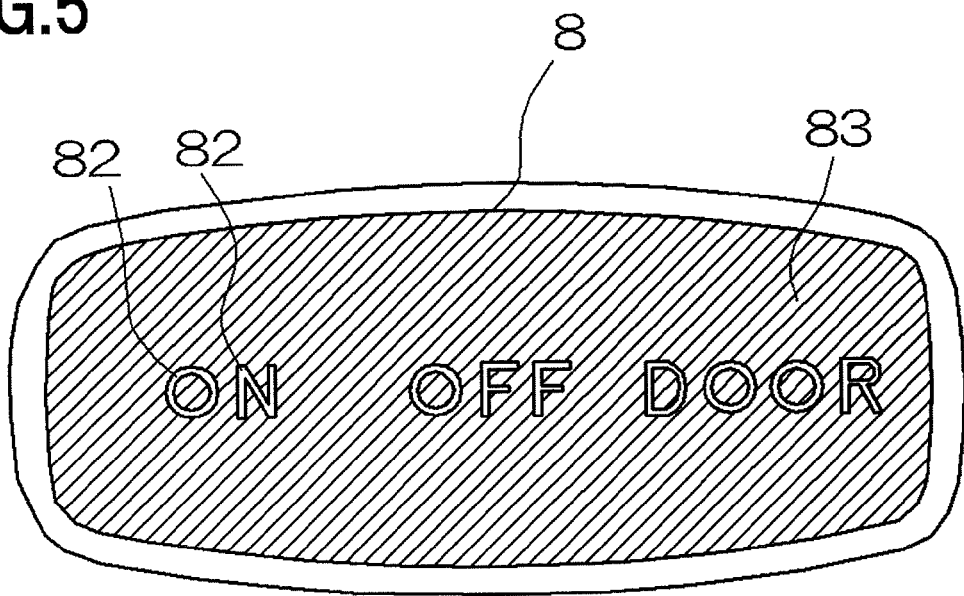
FIG. 5 is an explanatory plan view of an operation part of the touch switch device with the illuminator.

As depicted in FIG. 5, in the in-cabin lamp switch 100, characters indicating operation parts such as "ON" and "OFF" may be formed with transmission patterns 82, and the other portion of the operation surface 8 may be used as a light shield 83. In this manner, visibility for the operator is enhanced, since the light inside the light guide plate 3 is emitted from the character portions. The mode of display is not limited thereto, and the operation parts 81 for display may have any designs.

The touch switch device 1 with the illuminator includes the planar wiring board 2, the light guide plate 3, and the detector 6. Detection electrodes 4 are provided on a surface (a surface on the side of the light guide plate 3) of the wiring board 2, and the surface of the wiring board 2 with the detection electrodes 4 provided thereon is located to face the surface of the light guide plate 3 opposite the operation surface 8. More specifically, the detection electrodes 4 disposed on the wiring board 2 are interposed between the wiring board 2 and the light guide plate 3. The detection electrodes 4 provided on the wiring board 2 and the light guide plate 3 may be located to contact each other as depicted in FIG. 2 (see FIG. 2) or may be located with a gap therebetween.

Regarding the wiring board 2, any materials may be used for the electrical conductor and the base insofar as conductive wiring patterns are formable, and a regular printed circuit board such as a printed circuit board made of an epoxy resin may be used. The detection electrodes 4 are formed with an electrical conductor on a one surface side (on the side of the light guide plate 3) of the wiring board 2. Alternatively, one detection electrode 4 may be configured with a plurality of electrode portions.

The detection electrodes 4 are arranged so as to correspond to the positions of the operation parts 81. More specifically, the detection electrodes 4 are arranged so as to be aligned with the positions of the operation parts 81 in the vertical direction of the wiring board 2. For example, the sizes and shapes of the detection electrodes 4 are not particularly limited, insofar as a touch on each operation part 81 by a human body is detectable with the given sizes and shapes of the operation parts 81.

The above exemplary in-cabin lamp switch 100 includes three operation parts 81 (81A, 81B, and 81C) on one light guide plate 3, and three detection electrodes 4 (4A, 4B, and 4C) are arranged on the wiring board 2 corresponding to the number and positions of the operation parts 81.

The wiring board 2 is equipped with a light-emitting device 5 serving as a light source for use in display on the operation surface 8. For example, the type, number, and illumination color of the light-emitting device 5 are not particularly limited, and for instance, a visible light LED may be used.

The position to dispose the light-emitting device 5 is not particularly limited, and for example, as depicted in FIG. 2, the light-emitting device 5 may be disposed at an end of the surface of the wiring board 2 opposite the detection electrodes 4.

The light guide plate 3 is located so as to face the surface of the wiring board 2 having the detection electrodes 4 provided thereon. The light guide plate 3 is disposed in such a way that the light introduced from the light-emitting device 5 is emitted to the outside from the operation surface 8 opposite the wiring board 2. The light guide plate 3 functions to guide the light discharged from the light-emitting device 5 to the surface on which the operation parts 81 are positioned to emit the light to the outside. The light guide plate 3 may be made from an insulative material such as a translucent or semi-translucent resin. The shape of the light guide plate 3 is not limited to the planar flat plate shape. The light guide plate 3 may also have, for example, a curved shape so far as a touch is detectable by the detection electrodes 4.

Any method may be adopted to introduce the light discharged from the light-emitting device 5 into the light guide plate 3. For example, the light-emitting device 5 and the light guide plate 3 may be faced directly to each other, such that the light guide plate 3 is irradiated with the light discharged, from the light-emitting device 5.

Figure 3:
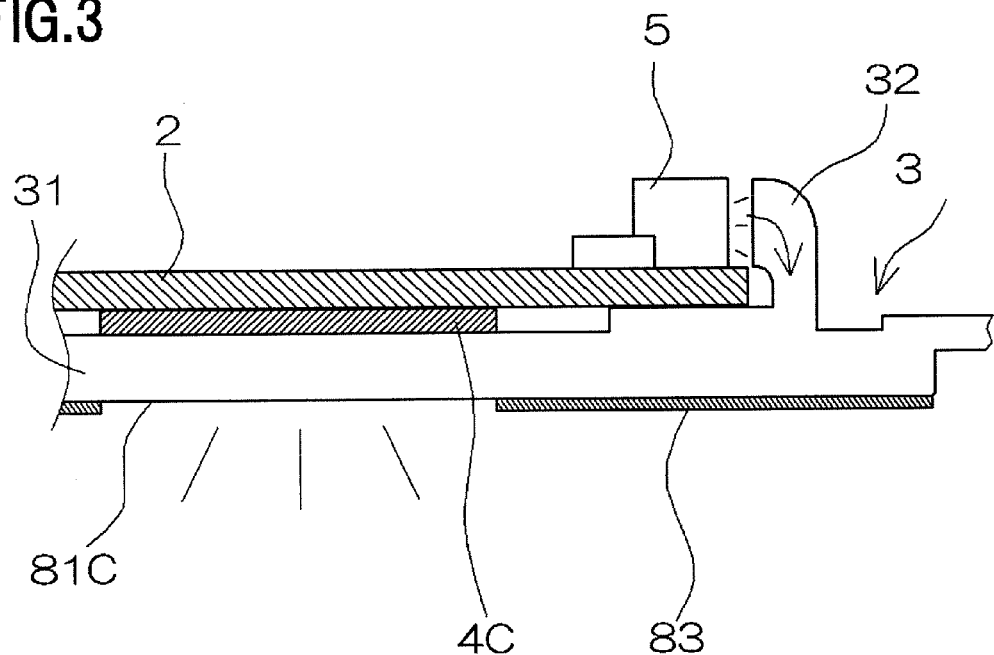
FIG. 3 is an explanatory partial cross-sectional view of a light-emitting device and a light guide plate extended portion of the touch switch device with the illuminator.

Further, the light guide plate 3 may be structured with a planar light guide plate main body 31 and an extended portion 32. The light guide plate main body 31 is disposed to cover at least the detection electrodes 4 portion. The extended portion 32 extends from the light guide plate main body 31 to the side of the wiring board 2, so as to guide the light discharged from the light-emitting device 5 to the light guide plate main body 31. In this manner, for example, as depicted in FIG. 3, the extended portion 32 is extended from the light guide plate main body 31 to face the light-emitting device 5 disposed on the other surface (the surface opposite the light guide plate 3) of the wiring board 2, such that the light discharged from the light-emitting device 5 is introduced from the extended portion 32 into the light guide plate main body 31.

The wiring board 2 and the light guide plate 3 are preferably secured integrally to each other. This is because the touch switch device 1 with the illuminator is integrally structured and assembly is facilitated. Any method may be adopted to secure the wiring board 2 to the light guide plate 3. An exemplary method is such that, for example, a bore or a notch is provided in the wiring board 2, a locking pawl 33 is provided on the light guide plate 3, and the bore or notch and the locking pawl are brought into locking engagement. The locking pawl may be used as the extended portion, so as to introduce the light discharged from the light-emitting device 5 into the light guide plate main body 31.

Figure 4:
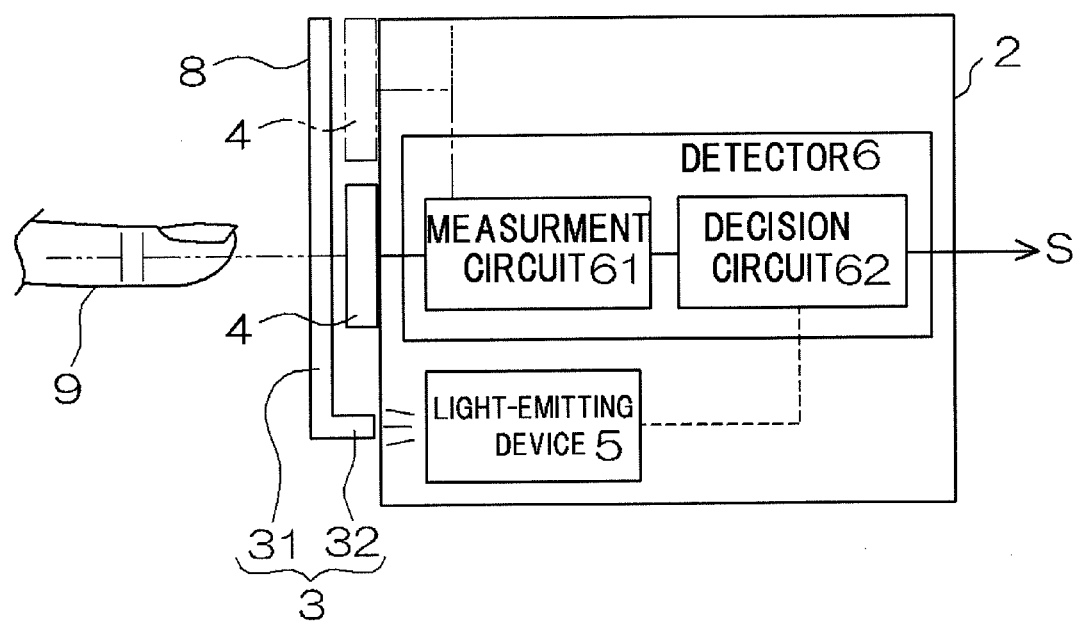
FIG. 4 is a block diagram depicting a structure of the touch switch device with the illuminator.

FIG. 4 is a block diagram depicting a structure of the touch switch device 1 with the illuminator. As described above, the touch switch device 1 with the illuminator includes the planar wiring board 2, the light guide plate 3, and the detector 6. The wiring board 2 has the light-emitting device 5 and the detection electrode 4 provided on a one surface side. The light guide plate 3 is located on the one surface side of the wiring board 2 so as to cause the light introduced from the light-emitting device 5 to be emitted to the outside from the operation surface 8 opposite the wiring board 2. The detector 6 is connected with the detection electrode 4 so as to detect a change in electrostatic capacitance to be generated at the detection electrode 4 when the human body 9 closely approaches or contacts the operation surface 8 and, based on the detected condition, generate a detection signal S. Further, the touch switch device 1 with the illuminator is connected to a power supply (not shown) for activating the light-emitting device 5 and the detector 6.

At the detection electrode 4, stray capacitance, and electrostatic capacitance with the earth (ground) are generated. The detector 6 detects a change in the stray capacitance generated at the detection electrode 4 or a change in the electrostatic capacitance between the detection electrode and the earth, so as to detect a human touch on the detection electrode 4 (the operation part 81). The specific structure of the detector 6 is not limited, and for example, the detector 6 may be configured with a measurement circuit 61 and a decision circuit 62. The measurement circuit 61 measures the electrical quantity corresponding to the electrostatic capacitance generated at the detection electrode 4 or the change thereof. The decision circuit 62 decides a touch of the human body 9 based on the measured value.

In the case where a plurality of detection electrodes 4 (operation parts 81) are provided, the detector 6 is configured to decide a touch per detection electrode 4.

The detector 6 may be disposed at any position, but the position is preferably on the wiring board 2. Arranging circuitry configuring the detector 6 on the wiring board 2 allows for an integral structure of the touch switch device 1 with the illuminator without electrical wires except those for minimum inputs/outputs and power source.

The processing of the detector 6 may be implemented by either hardware or software, suitably by using mainly a microcontroller (microcomputer) including, for example, a CPU, a memory such as a ROM and a RAM, and an input/output circuit (not shown). Further, other logic circuits such as a programmable logic circuit and/or a gate array may be used for the configuration. The measurement circuit 61 may be incorporated in, for example, the microcontroller.

The measurement circuit 61 is configured to measure the electrical quantity corresponding to electrostatic capacitance to be generated at the detection electrode 4 connected to the circuit 61. The measurement circuit 61 may measure electrical quantities of any type, and for example, a change in impedance or frequency may be measured besides the potential of the detection electrode 4. It may be configured such that the measurement circuit 61 transmits the measured value to the decision circuit 62, and that the decision circuit 62 decides the presence/absence of a touch or the degree of approach of the human body 9 based on the measured value.

No particular limitation is set for the configurations of the detection electrode 4, the measurement circuit 61, and the decision circuit 62, and the touch detection system, and any configurations or detection systems for use in known touch sensors are applicable. For example, one electrode may be provided as the detection electrode 4, and measurement may be performed on the stray capacitance generated at the electrode or electrostatic capacitance generated between the detection electrode and the earth. In this case, it may be configured such that the potential of the detection electrode 4 is detected as the electrical quantity, and that a value corresponding to the potential is obtained by using, for example, an analogue/digital converter disposed in the measurement circuit 61. Alternatively, two electrodes may be provided as the detection electrode 4, and electrostatic capacitance generated between the two electrodes may be measured.

The decision circuit 62 is configured to have the measurement circuit 61 measure the electrical quantity being generated at the detection electrode 4 in a certain cycle (a sampling cycle) and to accept the measured value as an input. The sampling cycle may be appropriately set, for example, to 1 ms. Then, the decision circuit 62 may compare the measured value with a predetermined threshold value, so as to decide a touch when the measured value is above or below the threshold value.

Further, the decision circuit 62 may be configured to perform processing such as filtering appropriately based on fluctuation of the measured value over time, so as to obtain a measured value with noise components reduced. Generally, the electrical quantity generated at the detection electrode 4 changes due to environmental conditions such as temperature or humidity in addition to the presence/absence of a touch. As a result, the measurement circuit 61 may obtain a measured value with, for example, the level thereof changed. For this reason, the predetermined threshold value is preferably set by performing calculation from time to time based on the temporal fluctuation of the measured value. Regarding the determination as to the presence/absence of a touch, various methods for decision may be applied, such methods including determining a touch when the measured value exceeds a threshold value for a certain length of time in order to avoid erroneous determination due to the influence of noise.

The detector 6 (decision circuit 62) is electrically connected with various types of apparatuses and equipment, such as an illuminator, an air conditioner, an audio/video instrument, and an automatically openable/closable window, and may be configured to output to such apparatuses a detection signal S for prompting the determination or an operation based on the determination when it is determined that a touch of a human body has occurred. For example, the in-cabin lamp switch 100 may be configured such that, when a touch on the operation part 81A ("ON") is detected, the interior light is turned on, when a touch on the operation part 81B ("OFF") is detected, the interior light is turned off, and when a touch on the operation part 81C ("DOOR") is detected, the interior light is turned on or off in response to a door opening/closing signal.

The number of the light-emitting device 5 and control of illumination/non-illumination may be appropriately set. The light-emitting device 5 may be constantly on, or may be constantly on in dark surroundings. Alternatively, the detector 6 may be used to control illumination of the light-emitting device 5.

The detector 6 (decision circuit 62) may be configured to control illumination of the light-emitting device 5 according to the detected touch conditions. More specifically, the detector 6 may be configured to turn on and off the illumination of the light-emitting device 5 according to, for example, the presence/absence of a touch or the degree of approach of a human body, and/or to change the intensity or color of illumination. For example, the light-emitting device 5 may be activated for illumination or the intensity of illumination may be increased when it is determined that a human body has closely approached the operation part 81. Alternatively, it may be configured such that the state of illumination of the light-emitting device 5 may be controlled according to whether the switch corresponding to the operation part 81 is on or off.

It is to be noted that the present disclosure is not limited to the above-disclosed embodiments and may be embodied in forms that are variously modified according to the purpose and use within the scope of the present disclosure. The touch switch device with an illuminator according to the present disclosure is not only applicable for the in-vehicle use as exemplified but also to apparatuses and equipment to be installed indoors and outdoors. Further, wide application is available as an operation part for various devices and instruments, such as illuminators, air conditioners, audio/video instruments, and motorized devices, besides the exemplified lamp switch device.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above-described embodiments, and various variations and modifications may be possible without departing from the scope of the present invention.

What is claimed is:

1. A touch switch device with an illuminator for detecting one of proximity to or contact of a human body to an operation surface, comprising:
    a planar wiring board having a light-emitting device and a detection electrode provided on a one surface side of the wiring board opposite the light-emitting device;
    a light guide plate located on the one surface side of the wiring board, the light guide plate being configured to emit light introduced from the light-emitting device toward an outside of the operation surface in a direction that is opposite to the wiring board; and
    a detector connected with the detection electrode, the detector being configured to perform detection of a change in an electrostatic capacitance generated at the detection electrode when a human body is proximate to or contacts the operation surface, to produce a detection signal corresponding to a condition of the detection, wherein
    an operation part is displayable on a surface of the light guide plate to serve as the operation surface, and the operation part is positioned corresponding to a position of the detection electrode,
    the light guide plate includes an extended portion that faces the light-emitting device such that light emitted from the light-emitting device is introduced directly to the light guide plate via the extended portion, and
    the extended portion faces the light-emitting device on a side of the wiring board opposite the one surface side such that the wiring board is provided between the light-emitting device and the operation surface.

2. The touch switch device with the illuminator according to claim 1, wherein the operation part is displayable by way of a transmission pattern for transmitting light from the light guide plate to the outside, and the operation surface of the light guide plate excluding the transmission pattern is light-shielded.

3. The touch switch device with the illuminator according to claim 1, wherein
    the light guide plate includes:
        a planar light guide plate main body disposed to cover at least the detection electrode; and
        the extended portion extending from the light guide plate main body to the side of the wiring board opposite the one surface side of the wiring board, the extended portion being configured to guide light discharged from the light-emitting device to the light guide plate main body.

4. The touch switch device with the illuminator according to claim 1, wherein the operation part is displayable by way of a transmission pattern for transmitting light from the light guide plate to the outside, the operation surface of the light guide plate excluding the transmission pattern is light-shielded, and
    the light guide plate includes:
        a planar light guide plate main body disposed to cover at least the detection electrode; and
        the extended portion extending from the light guide plate main body to the side of the wiring board opposite the one surface side of the wiring board, the extended portion being configured to guide light discharged from the light-emitting device to the light guide plate main body.

5. The touch switch device with the illuminator according to claim 4, wherein
    the operation part is a plurality of operation parts arranged on the light guide plate,
    the detection electrode is a plurality of detection electrodes arranged on the wiring board, and
    each detection electrode respectively corresponds to a position of each operation part.

6. The touch switch device with the illuminator according to claim 4, wherein the detector is configured to control illumination of the light-emitting device according to a condition of the detection.

7. The touch switch device with the illuminator according to claim 4, wherein the light guide plate includes a locking pawl extending to the side of the wiring board, and the light guide plate and the wiring board are integrally engaged with each other by the locking pawl.

8. The touch switch device with the illuminator according to claim 2, wherein the operation surface of the light guide plate excluding the transmission pattern is light-shielded by a light shield, which is provided on the operation surface of the light guide plate.

* * * * *